United States Patent [19]

Inoue

[11] Patent Number: 5,691,942
[45] Date of Patent: Nov. 25, 1997

US005691942A

[54] SEMICONDUCTOR MEMORY HAVING EXTENDED DATA OUT FUNCTION

[75] Inventor: Yoshinori Inoue, Hyogo, Japan

[73] Assignee: Mitsubishi Denki Kabushiki Kaisha, Tokyo, Japan

[21] Appl. No.: 541,546

[22] Filed: Oct. 10, 1995

[30] Foreign Application Priority Data

Nov. 30, 1994 [JP] Japan ................................. 6-296761

[51] Int. Cl.$^6$ ........................................... G11C 7/00
[52] U.S. Cl. ................... 365/189.05; 365/193; 365/201
[58] Field of Search ......................... 365/189.05, 201, 365/193

[56] References Cited

U.S. PATENT DOCUMENTS 5,515,332   5/1996   Pascucci et al. ............ 365/189.05 X
5,521,879   5/1996   Takasugi ...................... 365/189.05 X
5,532,961   7/1996   Mori et al. ................... 365/189.05
5,535,171   7/1996   Kim et al. ................... 365/189.05 X

*Primary Examiner*—Do Hyun Yoo
*Attorney, Agent, or Firm*—Lowe, Price, LeBlanc & Becker

[57] ABSTRACT

In a semiconductor memory, bit data read out of a memory cell are placed on a data line pair. The gate control circuit detects the transfer of the bit data to the data line pair and activates the control signal. The active control signal turns on the transfer gates located between the data line pair and the output buffer circuit so that the bit data are transferred and held by the latch circuits. The output buffer circuit releases output data represented by the latched bit data to the outside by way of the data input/output pin. This arrangement and operation eliminate the floating state of external output data and extend the duration of valid external output data in one operation cycle.

13 Claims, 11 Drawing Sheets

FIG. 7

| Df1 ($\overline{Df1}$)<br>Df2 ($\overline{Df2}$)<br>Df3 ($\overline{Df3}$)<br>Df4 ($\overline{Df4}$) | H (L)<br>H (L)<br>H (L)<br>H (L) | L (H)<br>L (H)<br>L (H)<br>L (H) | H (L)<br>L (H)<br>H (L)<br>H (L) |
|---|---|---|---|
| D ($\overline{D}$) | H (L) | H (L) | L (H) |
| TEST RESULT | PASS<br>(CONSISTENT) | PASS<br>(CONSISTENT) | FAIL<br>(INCONSISTENT) |

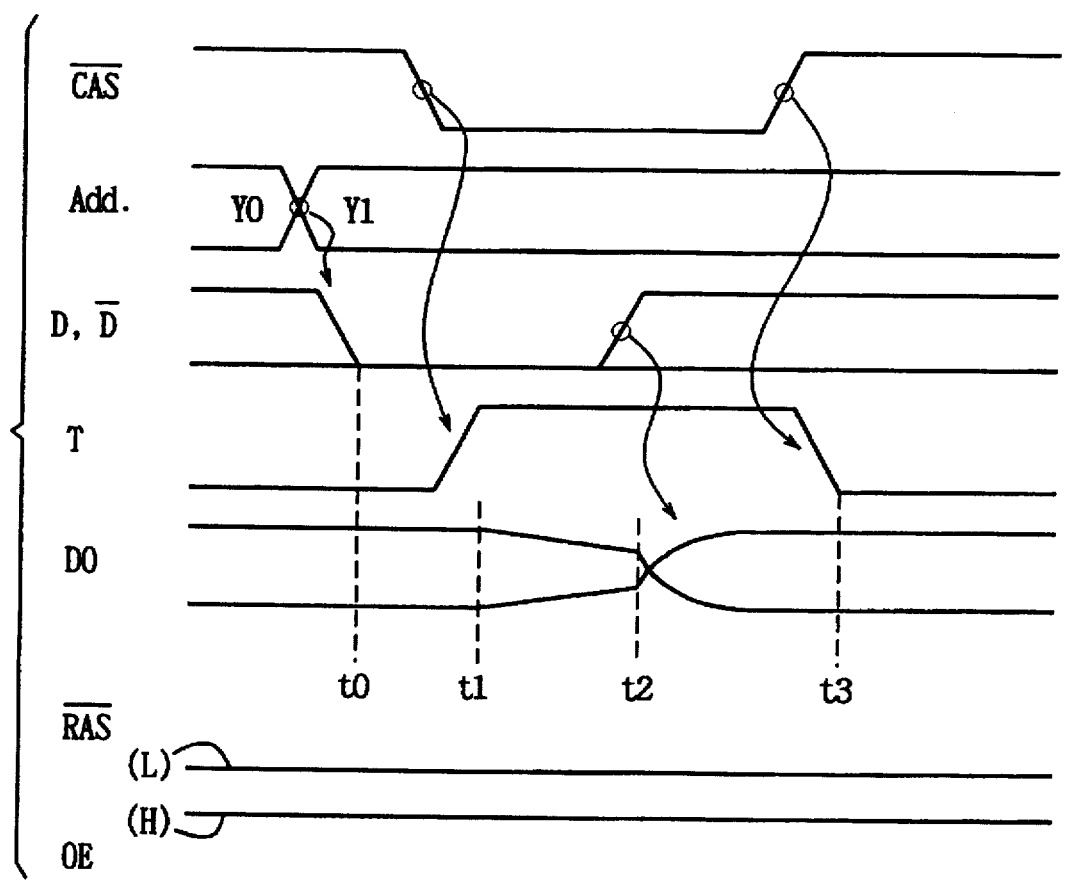
F I G. 1 2 PRIOR ART

SEMICONDUCTOR MEMORY HAVING EXTENDED DATA OUT FUNCTION

BACKGROUND OF THE INVENTION

1. Field of the Invention

The present invention relates to a semiconductor memory, and particularly to a dynamic random access memory having the EDO (Extended Data Out) function.

2. Description of the Prior Art

Some conventional dynamic random access memories (will be termed "DRAMs" hereinafter) have the fast page function. The fast page function is to make access to a plurality of memory cells by switching the column address together with the column address strobe signal $\overline{CAS}$, while retaining the row address strobe signal $\overline{RAS}$ active, and, in addition, to commence the access operation upon detecting the switching of the column address when the $\overline{CAS}$ signal is high level during the active period of the $\overline{RAS}$.

FIG. 9 is an operational timing chart of the conventional DRAM having the fast page function, showing the $\overline{RAS}$ and $\overline{CAS}$ signals and external output data DO.

With reference to FIG. 9, at the time of data readout, the $\overline{RAS}$ signal goes low level, and each time the $\overline{CAS}$ signal goes low level, external output data DO is released to the outside by way of the data output pin. In this case, the output buffer circuit is activated to deliver the external output data when the $\overline{CAS}$ signal is low level.

The external output data DO is in a floating state, i.e., the external output data DO approach an intermediate level between the high and low levels, during the periods from t1 to t2 and from t3 to t4.

Recent DRAMs are required to operate in high-frequency operation cycles, and therefore the $\overline{CAS}$ signal has short durations of a high level and low level. On this account, a system including DRAMs with the fast page function having the floating output state will suffer a reduced margin in fetching valid data.

In order to overcome this deficiency, there has been proposed a DRAM with the EDO function. FIG. 10 is an operational timing chart of this DRAM with the EDO function, showing the $\overline{RAS}$ and $\overline{CAS}$ signals and external output data DO like those in FIG. 9.

With reference to FIG. 10, this DRAM with the EDO function releases the external output data DO when the $\overline{CAS}$ signal goes low, and retains the valid data DO even after the CAS signal goes high.

Next, the specific circuit arrange of the conventional DRAM having the EDO function will be explained with reference to FIG. 11.

The output circuit of the DRAM includes a pair of data lines DB and $\overline{DB}$, transfer gates 11 and 12, latch circuits 13 and 14, an output buffer circuit OB, and a data input/output pin DQ.

The latch circuit 13 consists of inverters 131 and 132, and the latch circuit 14 consists of inverters 141 and 142. The output buffer circuit OB consists of NAND gates 15 and 16, inverters 17 and 18, and n-channel MOS transistors 19 and 20.

Among the data line pair DB and $\overline{DB}$ on which data D and $\overline{D}$ read out of a memory cell (not shown) are placed, the data line DB is connected through the transfer gate 11 to one input of the NAND gate 15, and the data line $\overline{DB}$ is connected through the transfer gate 12 to one input of the NAND gate 16.

Each of the transfer gates 11 and 12 consists of an n-channel MOS transistor, with its gate terminal receiving an internal control signal T that is an inverted version of the row address strobe signal $\overline{RAS}$.

The latch circuit 13, which is the antiparallel connection of the inverters 131 and 132, is connected to the line which connects the output of the transfer gate 11 to the one input of the NAND gate 15. Namely, the input of the inverter 131 and the output of the inverter 132 are connected together to the line between the transfer gate 11 and the NAND gate 15.

The latch circuit 14, which is the antiparallel connection of the inverters 141 and 142, is connected to the line which connects the output of the transfer gate 12 to the one input of the NAND gate 16. Namely, the input of the inverter 141 and the output of the inverter 142 are connected together to the line between the transfer gate 12 and the NAND gate 16.

The NAND gates 15 and 16 have their other inputs receiving the output enable signal OE, and release output signals that are inverted versions of their input signals. The transistors 19 and 20 are connected in series between a power node N1 and ground node N2 which are supplied with the power voltage and ground voltage, respectively. The line which connects the transistors 19 and 20 is connected to the data input/output pin DQ.

The NAND gate 15 has its output signal fed through the inverter 17 to the gate terminal of the transistor 19, and the NAND gate 16 has its output signal fed through the inverter 18 to the gate terminal of the transistor 20.

Next, the operation of the output circuit shown in FIG. 11 will be explained. FIG. 12 is an operational timing chart of the output circuit shown in FIG. 11, showing the $\overline{CAS}$ signal, address signal Add, data D and $\overline{D}$, internal control signal T, external output data DO, $\overline{RAS}$ signal, and output enable signal OE.

During the operation explained in the following, the $\overline{RAS}$ signal is kept low and the output enable signal OE is kept high. When the external address signal Add is switched from Y0 to Y1, the data line pair DB and $\overline{DB}$ are reset and data D and $\overline{D}$ both go low at time point t0. At this time point, valid external output data DO for the old address Y0 is still placed on the data output pin DQ as it is retained in the latch circuits 13 and 14.

The internal control signal T goes high at time point t1 in response to the fall of the $\overline{CAS}$ signal to low. The transfer gates 11 and 12 become conductive, and data D and D in a reset state are loaded into the latch circuits 13 and 14.

Because of the presence of a high output enable signal OE, the NAND gates 15 and 16 produce high-level outputs, and the transistors 19 and 20 are supplied with low-level signals on their gate terminals. Accordingly, both transistors 19 and 20 are cut off, and external output data DO is in a floating state until time point t2 when data for the new address Y1 is placed on the data line pair DB and $\overline{DB}$.

Data D and $\overline{D}$ for the address Y1 is placed on the data line pair DB and $\overline{DB}$. In this case, the internal control signal T is high, and both transfer gates 11 and 12 are conductive continuously.

Accordingly, data D and $\overline{D}$ for the address Y1 are transferred to the latch circuit 13 and NAND gate 15, and the latch circuit 14 and NAND gate 16, respectively.

The latch circuits 13 and 14 hold the data for the address Y1, and one of the transistors 19 and 20 turns on, causing the external output data DO for the address Y1 to be delivered through the data input/output pin DQ.

After that, the internal control signal T goes low in response to the rise of the $\overline{CAS}$ signal to high. Data on the data line pair DB and $\overline{DB}$ are no more conducted to the latch circuits 13 and 14 and the NAND gates 15 and 16, and the external output data DO for the address Y1 held by the latch circuits 13 and 14 is kept valid on the data input/output pin DQ.

However, in the output circuit of FIG. 11, external output data DO is in a floating state during the period from t1 to t2 because of the reset state of data on the data line pair DB and $\overline{DB}$ after the internal control signal T has risen to high and until data D and $\overline{D}$ for the new address Y1 are placed on the data line pair DB and $\overline{DB}$.

On this account, the output circuit of FIG. 11 does not solve the problem of the shorter output period of valid external data in one operation cycle. In addition, this output circuit cannot exert the advantage of the EDO function due to the occurrence of the floating state.

Moreover, the output circuit of FIG. 11 has a problem of the shorter output period of valid external data in one operation cycle not only during the usual readout operation, but also during the multi-bit test due to the occurrence of the floating state.

The multi-bit test mentioned here is the test of multiple bits carried out in parallel. Specifically, same bit data is written to multiple bits, the contents of these bits are read out simultaneously, and the retrieved data are compared thereby to verify the operation of these bits.

The usual output circuit as shown in FIG. 11 is also used for the multi-bit test, and the occurrence of the floating state as described above reduces the output period of valid external data showing the result of the multi-bit test in one operation cycle.

SUMMARY OF THE INVENTION

An object of the present invention is to provide a semiconductor memory which eliminates the floating state of external output data so that the period of valid external output data in one operation cycle is extended.

Another object of the present invention is to provide a semiconductor memory which eliminates the floating state of external output data so that the period of valid external output data in one operation cycle is extended for the multi-bit test.

A semiconductor memory according to one aspect of this invention includes a memory cell array, a data line pair, latch circuits, gate circuits, a gate control circuit, and an output buffer circuit.

The memory cell array consists of a plurality of memory cells for storing bit data. The data line pair carry bit data read out of a memory cell of the memory cell array.

The latch circuits hold bit data carried by the data line pair. The gate circuits which receive a control signal respond to an active control signal to deliver bit data on the data line pair to the latch circuits.

The gate control circuit activates the control signal by detecting the transfer of bit data onto the data line pair at the time of data readout. The output buffer circuit releases output data represented by the bit data hold by latch circuits to the outside.

In operation, bit data read out of a memory cell of the memory cell array is placed on the data line pair. The gate control circuit detects the transfer of bit data onto the data line pair and activates the control signal.

The gate circuits respond to the active control signal to transfer the bit data on the data line pair to the latch circuits. The output buffer circuit releases output data represented by the bit data held in the latch circuits to the outside.

The latch circuits renew the contents at the time when bit data are placed on the data line pair, and the circuits retain the old bit data until this time point so that output data represented by the old bit data in the latch circuits is released to the outside. Output data derived from the new contents of the latch circuits is released to the outside after the new bit data are placed on the data line pair.

Namely, upon detecting the transfer of bit data read out of a memory cell of the memory cell array onto the data line pair, the transferred bit data is held in the latch circuits. Accordingly, the old bit data in the latch circuits are replaced with the new bit data at the time point when the bit data are placed on the data line pair.

Consequently, it is possible to prevent external output data from having a floating state at the time of switching from old bit data to new bit data on the data line pair, and it becomes possible to extend the duration of valid external output data in one operation cycle.

The semiconductor memory may further include amplifying circuits inserted amid the path of the data line pair so that bit data read out of a memory cell and transferred to the data line pair is amplified. The gate control circuit receives bit data on the data line pair before the data are amplified and detects the transfer of bit data onto the data line pair based on the data level.

In this case, bit data read out of a memory cell of the memory cell array is transferred to the data line pair by way of the amplifying circuits, and therefore transfer of data is delayed by the amplifying circuits.

The gate control circuit detects the transfer of bit data onto the data line pair based on the data level before the data are amplified by the amplifying circuits, and, in response to the detection, activates the control signal so that the gate circuits conduct the bit data to the latch circuits.

Namely, whether bit data are placed on the data line pair is detected based on the data level before the data are amplified by the amplifying circuits, i.e., the detection is prior to the amplification of data signal by the amplifying circuits, and therefore the delay of access is prevented.

Consequently, it is possible to prevent external output data from having a floating state, and in addition it is possible to prevent the delay of access caused by the delayed data transfer.

In this semiconductor memory, the gate control circuit may be designed to receive an internal control signal which is derived from the column address strobe signal supplied from the outside, and activate the control signal upon detecting the transfer of bit data onto the data line pair on condition that the internal control signal is active.

Namely, the gate control circuit activates the control signal upon detecting the transfer of data onto the data line pair on condition that the internal control signal derived from the column address strobe signal is active.

Accordingly, when the internal control signal becomes inactive, the gate circuits do not transfer bit data to the latch circuits, and output data represented by the old bit data in the latch circuits is released to the outside continuously. Consequently, when the column address signal is switched, the output data that has been released at the time of switching of the column address is released to the outside continuously.

The gate control circuit mentioned above may be arranged to include a first, second and third logic circuits as follows.

The first logic circuit produces a first logical signal indicative of the negative logical product of the logical levels of the data lines of data line pair. The second logic circuit produces a second logical signal that is an inverted version of the internal control signal. The third logic circuit produces a third logical signal indicative of the negative logical product of the first and second logical signals. The third logical signal is delivered as the control signal to the gate circuits.

Based on this circuit arrangement, the first logic circuit takes the negative logical product of the logical levels of the data line pair, and the first logical signal goes low when the logical level of at least one data line becomes high. When the internal control signal goes high (active), the second logic circuit produces a low-level second logical signal.

The third logic circuit, which takes the negative logical product of the first and second logical signals, produces a high-level third logical signal when the second logical signal goes low in response to the column address strobe signal and the first logical signal goes low after the transfer of data to the data line pair.

Based on this circuit arrangement, the gate control circuit operates to activate the control signal upon detecting the transfer of bit data onto the data line pair during a period when the internal control signal is active.

A semiconductor memory according to another aspect of this invention is designed to test multiple bits concurrently, and it includes a memory cell array, a first logic gate circuit, a second logic gate circuit, a data line pair, latch circuits, gate circuits, a gate control circuit, and an output buffer circuit.

The memory cell array consists of a plurality of memory cells for storing bit data. At the test, the first logic gate circuit receives bit data of a first polarity out of bit data pairs read out simultaneously from memory cells in which same bit data has been stored, and produces first data indicative of the exclusive negative logical product of the bit data of the first polarity.

The second logic gate circuit, at the test, receives bit data of a second polarity out of bit data pairs read out simultaneously from memory cells, and produces second data indicative of the exclusive logical product of the bit data of the second polarity.

The first and second data produced by the first and second logic gate circuits are placed on the data line pair. The latch circuits hold the first and second data placed on the data line pair. The gate circuits receive the control signal and transfer the first and second data on the data line pair to the latch circuits in response to the activation of the control signal.

The gate control circuit operates at testing to detect the transfer of the first and second data onto the data line pair, and activates the control signal upon detecting the data transfer. The output buffer circuit releases output data represented by the first and second data held in the latch circuits to the outside.

In operation, bit data pairs are read out simultaneously from memory cells of the memory cell array. Each bit data pair consists of bit data of the first polarity and bit data of the second polarity, and these bit data are fed to the first and second logic gate circuits, respectively.

The first logic gate circuit produces data indicative of the exclusive negative logical product of the bit data, and the second logic gate circuit produces data indicative of the exclusive logical product of the bit data. The first and second data are transferred from the first and second logic gate circuits onto the data line pair.

The gate control circuit activates the control signal upon detecting the transfer of the first and second data onto the data line pair. In response to the activation of the control signal, the gate circuits transfer the first and second data on the data line pair to the latch circuits.

The latch circuits hold the first and second data, and the output buffer circuit releases output data represented by the data held in the latch circuits to the outside.

Namely, the new first and second data is held by the latch circuit at the time point when the first and second data is placed on the data line pair. The latch circuits hold the old first and second data and output data represented by the old first and second data is released to the outside until it latches the new first and second data.

Output data represented by the newly latched first and second data is released to the outside after the new first and second data has been placed on the data line pair.

Namely, the transfer of the first and second data onto the data line pair is detected, and thereafter these data are held by the latch circuits.

Accordingly, the contents of the latch circuit are switched from the old data to the new data at the time point when the transfer of the first and second data onto the data line pair is detected.

Consequently, it is possible to prevent the external output data from having a floating state, and it becomes possible to extend the duration of valid external output data in one operation cycle at the multi-bit test.

This semiconductor memory may be arranged such that the first logic gate circuit includes a first NOR gate and a first logic circuit, and the second logic gate circuit includes a second NOR gate and a second logic circuit. A specific arrangement is as follows.

The first NOR gate produces data indicative of the negative logical product of multiple bit data of the first polarity received at the time of testing. The first logic circuit is connected between the first NOR gate and the gate circuit.

The second NOR gate produces data indicative of the negative logical product of multiple bit data of the second polarity received at the time of testing. The second logic circuit is connected between the second NOR gate and the gate circuit.

The gate control circuit receives data provided by the first and second NOR gates, and detects the transfer of the first and second data onto the data line pair based on the logical level of the data.

In operation, at the time of testing, multiple bit data of the first polarity which have been read out of memory cells of the memory cell array and fed to the first logic gate circuit are placed on the data line pair by way of the first NOR gate and first logic circuit. At the same time, multiple bit data of the second polarity which have been fed to the second logic gate circuit are placed on the data line pair by way of the second NOR gate and second logic circuit.

In this case, data transfer is delayed by the first logic circuit in the first logic gate circuit and by the second logic circuit in the second logic gate circuit. However, the transfer of the first and second bit data onto the data line pair is detected by the gate control circuit based on the logical level of the data at the outputs of the first and second NOR gates.

In response to the detection, the control signal is activated by the gate control circuit, and the gate circuits transfer the data to the latch circuits.

In this manner, whether bit data is placed on the data line pair is detected by the first and second logic gate circuits based on the logical level before the data is delayed by the logic circuits.

Namely, the detection of the transfer of the first and second data onto the data line pair is implemented prior to the logical processings by the first and second logic circuits.

Consequently, at the time of multi-bit test, it is possible to prevent external output data from having a floating state, and in addition it is possible to prevent the delay of access caused by the delayed data transfer.

This semiconductor memory may have its gate control circuit designed such that the gate control circuit receives the internal control signal derived from the column address strobe signal supplied from the outside and activates the control signal upon detecting the transfer of the first and second data onto the data line pair during the active period of the internal control signal.

Namely, the transfer of the first and second data to the latch circuits by the gate circuits does not take place when the internal control signal becomes inactive, and therefore output data represented by the first and second data held in the latch circuits is released to the outside continuously. Accordingly, when the column address signal is switched, it is possible to release continuously the data that has been released to the outside at the time of switching.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a truth table showing the relation of the input/output levels of the output circuit shown in FIG. 6 at the time of multi-bit test;

FIG. 12 is a timing chart showing the operational waveforms of various portions of the output circuit shown in FIG. 11.

DESCRIPTION OF THE PREFERRED EMBODIMENTS

Embodiments of this invention will be explained in detail with reference to the drawings.

First Embodiment

Figure 1:
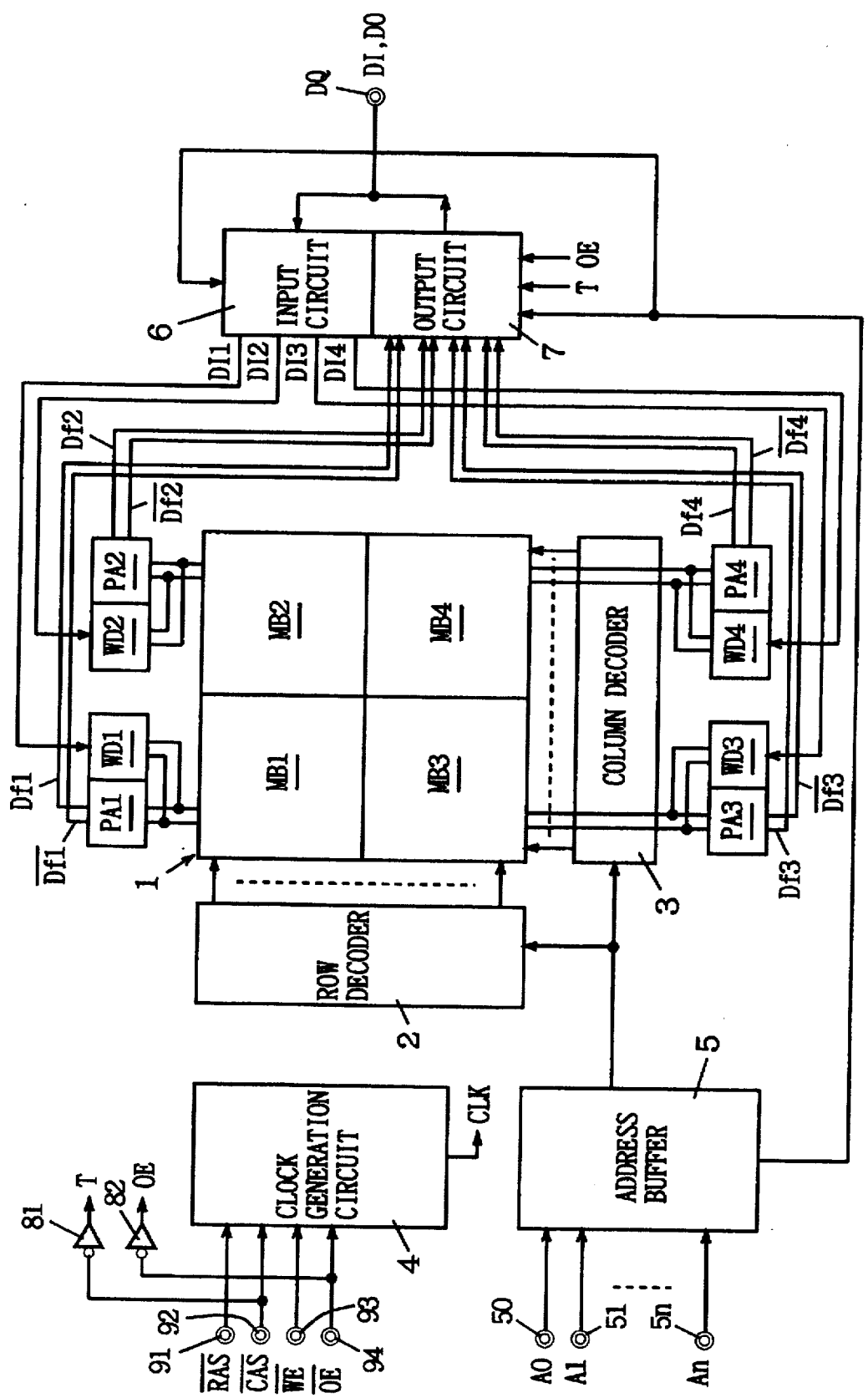
FIG. 1 is a block diagram showing the principal arrangement of the DRAM based on an embodiment of this invention.

FIG. 1 is a block diagram showing the principal arrangement of the DRAM based on an embodiment of this invention.

Referring to FIG. 1, the DRAM includes a memory cell array 1, a row address decoder 2, a column address decoder 3, a clock generation circuit 4, an address buffer 5, an input circuit 6, an output circuit 7, inverters 81 and 82, pre-amplifiers PA1 through PA4, write drivers WD1 through WD4, address input pins 50 through 5n, control input pins 91 through 94, and a data input/output pin DQ.

The memory cell array 1 consists of a plurality of memory cells arrayed on rows and columns, and is partitioned into four memory blocks MB1 through MB4. Each of the memory blocks MB1 through MB4 consists of a plurality of memory cells arrayed on rows and columns.

The control input pin 91 receives the row address strobe signal $\overline{RAS}$, the control input pin 92 receives the column address strobe signal $\overline{CAS}$, the control input pin 93 receives the write/read control signal $\overline{WE}$, and the control input pin 94 receives the external output enable signal $\overline{OE}$, all supplied from the outside.

The clock generation circuit 4 generates a clock signal CLK in response to the row address strobe signal $\overline{RAS}$, column address strobe signal $\overline{CAS}$, write/read control signal $\overline{WE}$ and external output enable signal $\overline{OE}$. The clock signal CLK is fed to various portions of the DRAM and used for their operation.

The external address signals A0 through An received on the address input pins 50 through 5n is fed to the address buffer 5, which then delivers the internal address signal derived from the signals A0 through An to the row address decoder 2, column address decoder 3, input circuit 6 and output circuit 7.

The inverter 81 receives the column address strobe signal $\overline{CAS}$ and delivers the internal control signal T which is an inverted version of the $\overline{CAS}$ to the output circuit 7. Another inverter 82 receives the external output enable signal $\overline{OE}$ and delivers the internal output enable signal OE which is an inverted version of the $\overline{OE}$ to the output circuit 7.

The row address decoder 2 selects one or more rows of the memory cell array 1 in accordance with the internal address signal received by it. The column address decoder 3 selects one or more columns of the memory cell array 1 in accordance with the internal address signal received by it.

The pre-amplifier PA1 and write driver WD1 are provided for the memory block MB1, the pre-amplifier PA2 and write driver WD2 are provided for the memory block MB2, the pre-amplifier PA3 and write driver WD3 are provided for the memory block MB3, and the pre-amplifier PA4 and write driver WD4 are provided for the memory block MB4.

Each of the pre-amplifiers PA1 through PA4 amplifies the bit data signal read out of a memory cell of a selected row and column in the corresponding memory block. Each bit data read out forms a pair of non-inverted bit data and inverted bit data. Accordingly, amplified bit data is also a bit data pair. The pre-amplifiers PA1 through PA4 produce bit data pairs Df1 and $\overline{Df1}$, Df2 and $\overline{Df2}$, Df3 and $\overline{Df3}$, and Df4 and $\overline{Df4}$, respectively, and these bit data pairs are fed to the output circuit 7. The write drivers WD1 through WD4 receive bit data DI1 through DI4 to be stored in memory cells of the respective memory blocks from the input circuit 6, and supply the bit data to the respective memory blocks.

External input data DI received on the data input/output pin DQ is fed to the input circuit 6, and external output data DO provided by the output circuit 7 is delivered to the outside through the data input/output pin DQ.

The data input circuit 6 delivers external input data to the write drivers WD1 through WD4 selectively in accordance with the internal address signal. The output circuit 7 supplies one of data pairs Df1 and $\overline{Df1}$ through Df4 and $\overline{Df4}$ provided by the pre-amplifiers PA1 through PA4 in accordance with the internal address signal, and delivers the selected data to the data input/output pin DQ in response to the internal control signal T and internal output enable signal OE.

The output circuit 7 includes an exclusive-OR circuit and exclusive-NOR circuit as a circuit section for the multi-bit test, in addition to the usual output circuit section. The circuit section for the multi-bit test is connected to the usual output circuit section when the multi-bit test is carried out. Connection or disconnection of the circuit section for the multi-bit test is switched in response to the internal address signal provided by the address buffer 5.

Figure 2:
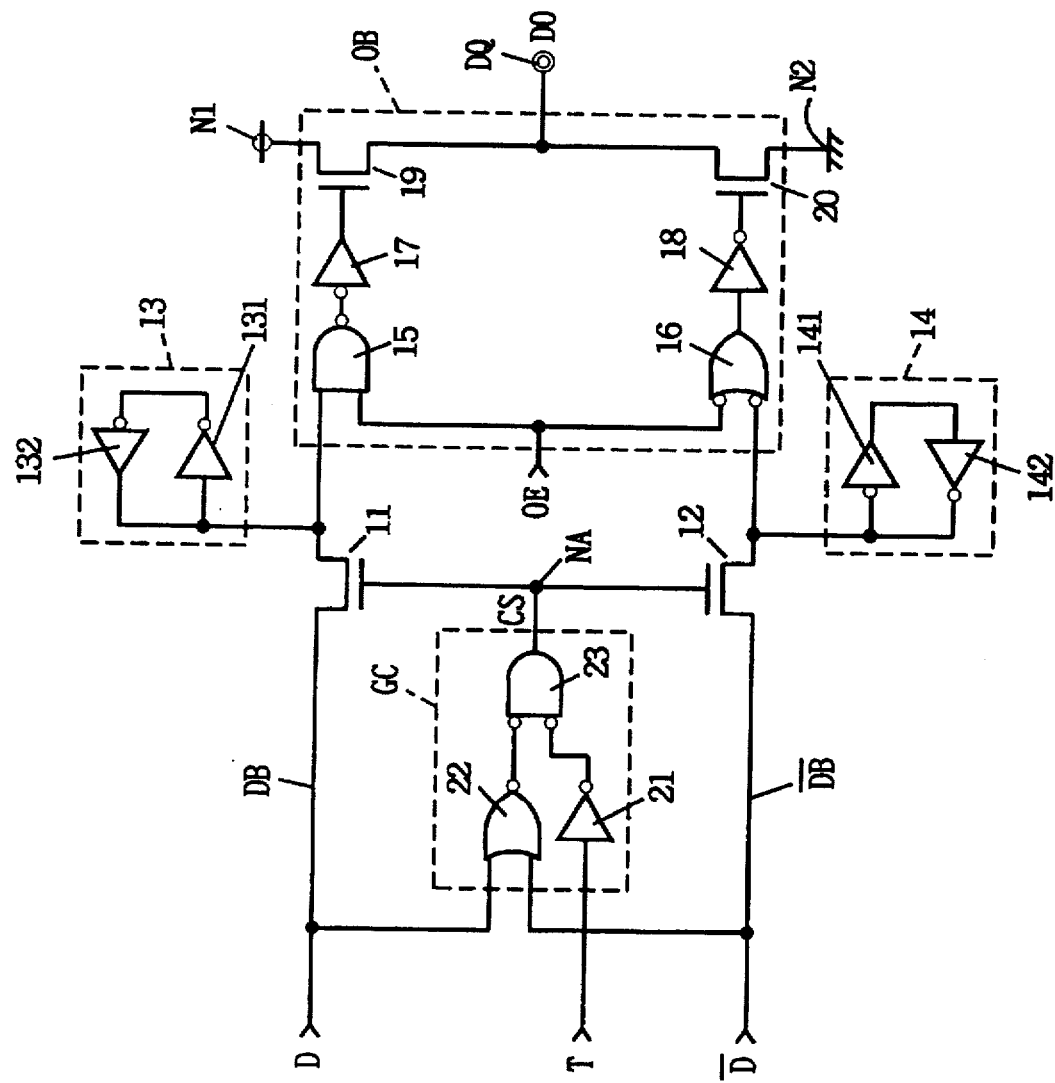
FIG. 2 is a schematic diagram of the principal portion of the output circuit based on a first embodiment.

Next, the output circuit 7 will be explained in more detail. FIG. 2 is a schematic diagram of the principal portion of the output circuit 7 of the first embodiment. In the figure, portions identical to those of FIG. 11 are referred to by the same symbols and explanation thereof will be omitted.

Figure 11:
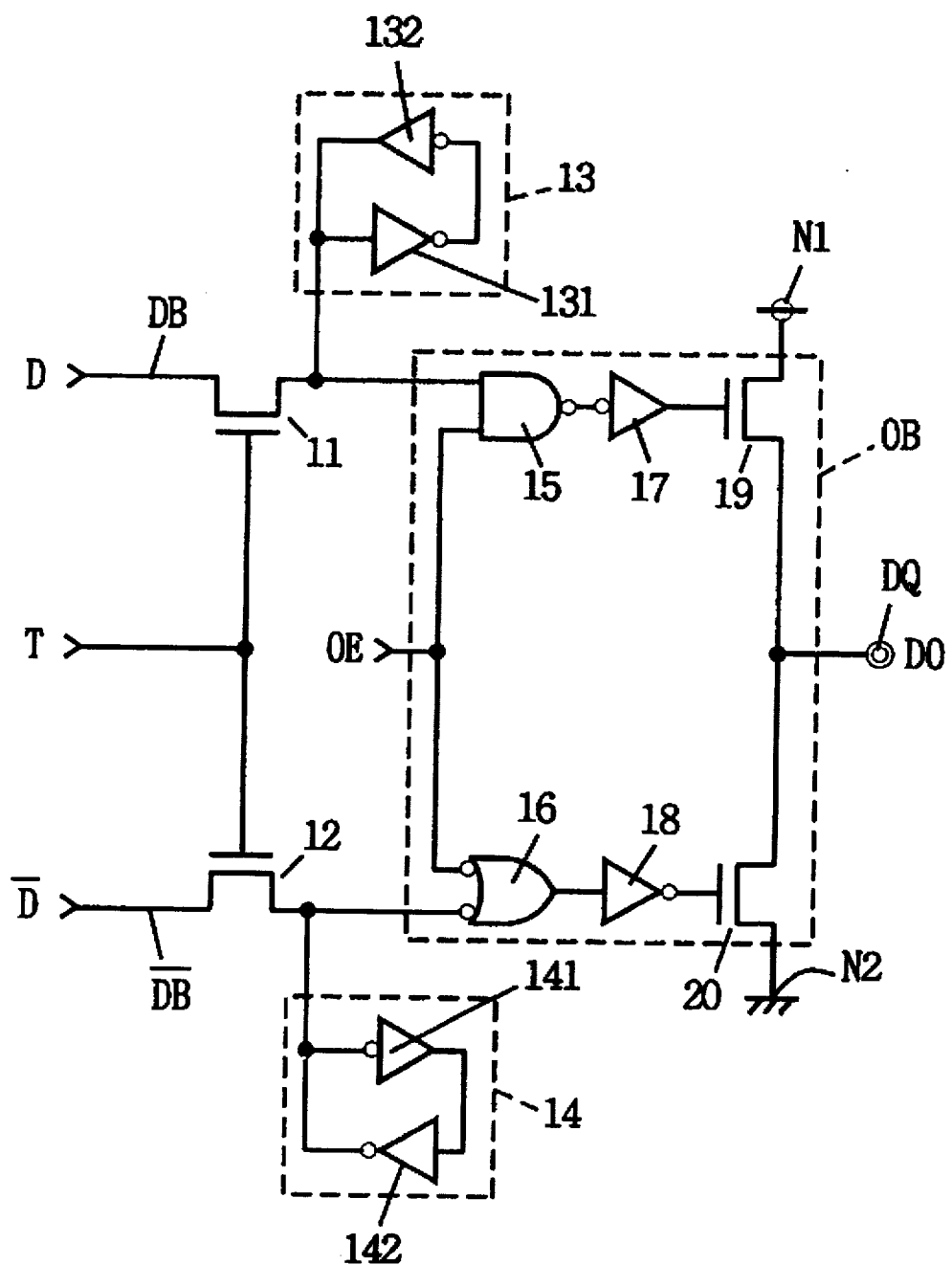
FIG. 11 is a schematic diagram of the output circuit of the conventional DRAM having the EDO function.

The output circuit shown in FIG. 2 differs from that of FIG. 11 in the provision of a gate control circuit GC. The gate control circuit GC, which consists of an inverter 21 and NOR gates 22 and 23, operates to control the transfer gates 11 and 12 in response to the internal control signal T and data D and $\overline{D}$ which have been read out of a memory cell of the memory cell array 1 and placed on the data buses DB and $\overline{DB}$.

The inverter 21 receives the internal control signal T and delivers the inverted signal to the NOR gate 23. The NOR gate 22 receives the data D and $\overline{D}$ and delivers the signal indicative of the negative logical product of the data to the NOR gate 23.

The NOR gate 23 produces a control signal CS indicative of the negative logical product of the two signals provided by the inverter 21 and NOR gate 22. The control signal CS is fed by way of the node NA to the gate terminals of the transfer gates 11 and 12.

The gate control circuit GC arranged as described above operates as follows. If the internal control signal T is low or the data D and $\overline{D}$ are both low, then the control signal CS is low.

Otherwise, if the internal control signal T is high and at least one of data D and $\overline{D}$ is high, then the control signal CS is high, because the inverter 21 and NOR gate 22 produce low output signals, causing the NOR gate 23 to produce a high output signal as a result of the negative logical product.

Accordingly, the transfer gates 11 and 12 become conductive only when the internal control signal T is high and at least one of data D and $\overline{D}$ is high.

Figure 3:
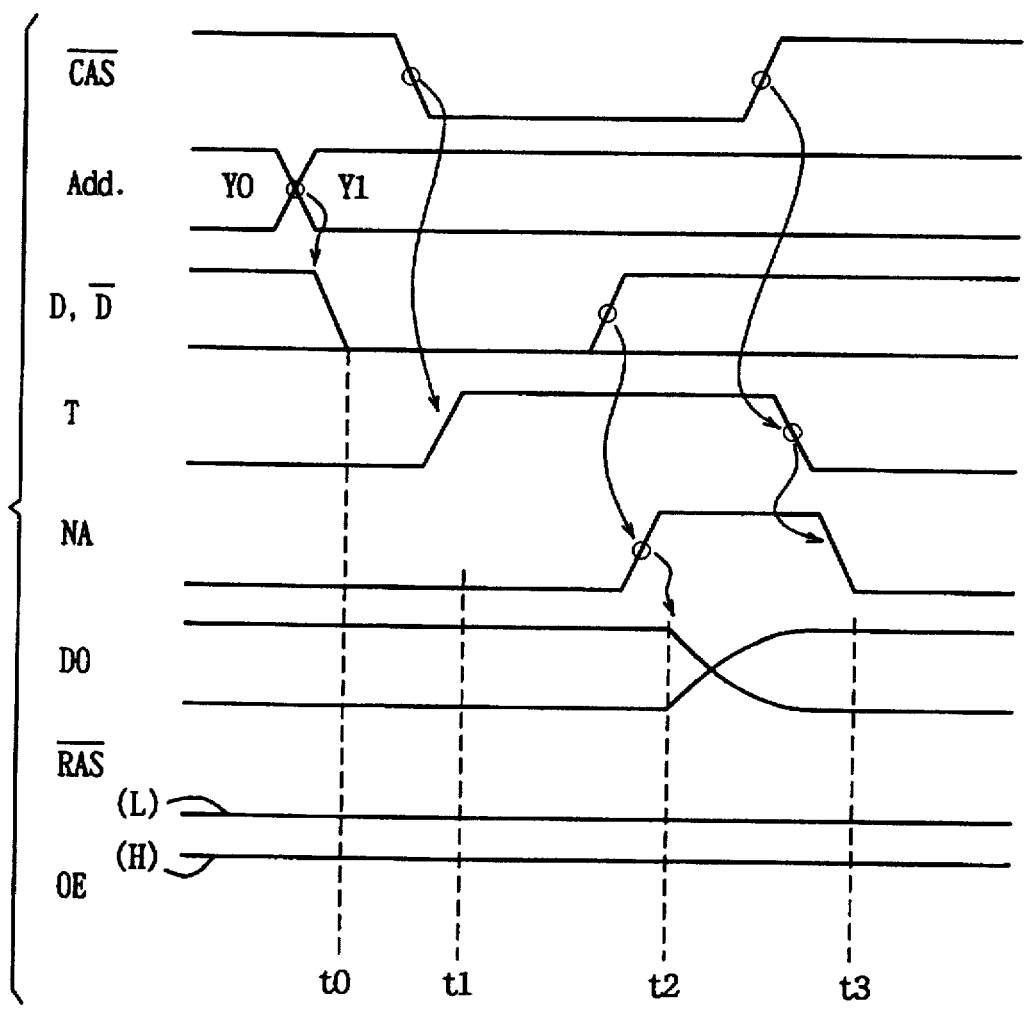
FIG. 3 is a timing chart showing the operational waveforms of various portions of the output circuit shown in FIG. 2.

Next, the operation of the overall output circuit shown in FIG. 2 will be explained. FIG. 3 is a timing chart showing the operational waveforms of various portions of the output circuit shown in FIG. 2. The explanation on the operational affair common to the conventional circuit arrangement explained in connection with FIG. 12 will be omitted.

The operational waveforms shown in FIG. 3 are identical to those of FIG. 12 except for the external output data DO and for the addition of the signal on the node NA.

In FIG. 3, the node NA has its logical level unvarying even after the internal control signal T goes high, and the transfer gates 11 and 12 are both kept non-conductive.

When data D and $\overline{D}$ are placed on the data line pair DB and $\overline{DB}$, the control signal CS goes high, causing the node NA to go high and the transfer gates 11 and 12 to become conductive.

Accordingly, during the period from the time point t1 when the internal control signal T goes high until the time point t2 when data D and $\overline{D}$ are placed on the data line pair DB and $\overline{DB}$ and the node NA goes high, external output data DO for the old address Y0 is released. Subsequently, only after data D and $\overline{D}$ for the new address Y1 is placed on the data line pair DB and $\overline{DB}$, the data D and $\overline{D}$ of the new address Y1 are transferred to the latch circuits 13 and 14. Accordingly, external output data DO for the new address Y1 is released only at the arrival of the time point t2.

Namely, in the output circuit of this embodiment, the transfer gates 11 and 12 are made conductive in response to the detection of the transfer of new data D and $\overline{D}$ onto the data line pair DB and $\overline{DB}$, and external output data DO represented by the new data D and $\overline{D}$ is released.

Consequently, it is possible to prevent external output data DO from having a floating state, and it becomes possible to extend the duration of valid external output data in one operation cycle.

Second Embodiment

The second embodiment of this invention pertains to the output circuit shown in FIG. 2, wherein it is devised to speed-up the access.

Generally, a DRAM has long data lines from memory cells of the memory cell array to the output circuit. Therefore, it necessitates some means of preventing the data waveform from becoming dull at the input of the output circuit.

A typical DRAM has the provision of an amplifying circuit amid the data path so that the data signal is amplified to regain the correct waveform. However, the use of such amplifying circuit results in a delayed data transfer and thus a delayed access to the DRAM. The output circuit of this embodiment is intended to avoid the delay of access.

Figure 4:
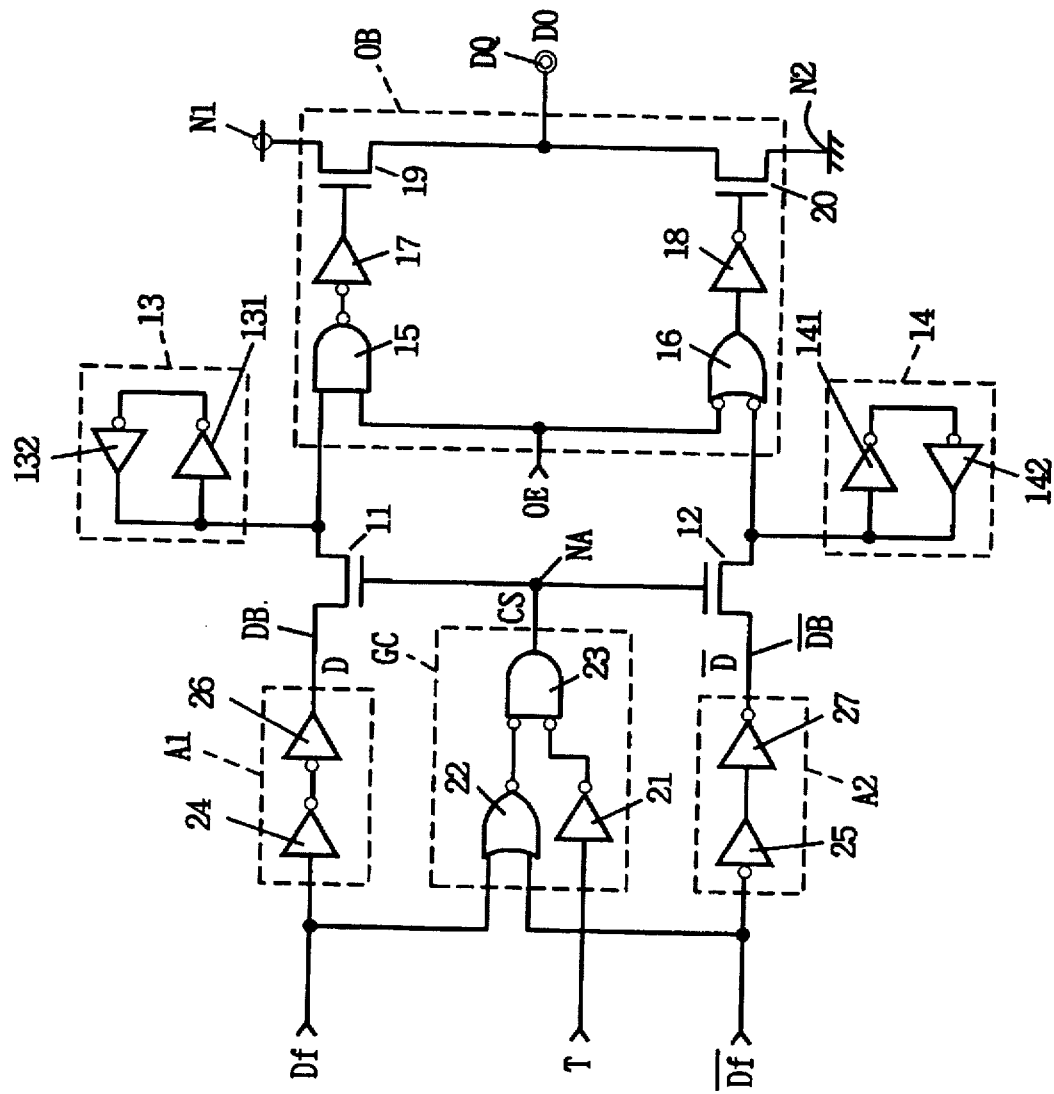
FIG. 4 is a schematic diagram of the principal portion of the output circuit based on a second embodiment.

FIG. 4 is a schematic diagram of the principal portion of the output circuit of this embodiment. In the figure, portions identical to those of FIG. 2 are referred to by the same symbols and the explanation thereof will be omitted.

Referring to FIG. 4, an amplifying circuit A1 is connected to the data line DB, and it consists of two inverters 24 and 26 connected in series. Another amplifying circuit A2 is connected to the data line $\overline{DB}$, and it consists of two inverters 25 and 27 connected in series.

Data Df and $\overline{Df}$ are a pair of data selected from among the data pairs Df1 and $\overline{Df1}$ through Df4 and $\overline{Df4}$ fed to the output circuit. The data Df is amplified by the amplifying circuit A1, and the amplified data D is placed on the data line DB. The data $\overline{Df}$ is amplified by the amplifying circuit A2, and the amplified data $\overline{D}$ is placed on the data line $\overline{DB}$.

The output circuit of FIG. 4 differs from that of FIG. 2 in the following affairs. In the gate control circuit GC, the NOR gate 22 receives bit data Df that is not amplified yet by the amplifying circuit A1 and bit data $\overline{Df}$ that is not amplified yet by the amplifying circuit A2. Accordingly, in the output circuit shown in FIG. 4, the gate control circuit GC produces a high-level control signal CS when the internal control signal T is high and, at the same time, when at least one of the data Df and $\overline{Df}$ is high.

In consequence, the transfer gates 11 and 12 become conductive in response to the detection of the transfer of bit data Df and $\overline{Df}$ without delay, and external output data DO represented by the newly transferred data is released to the outside.

Consequently, in the output circuit in this embodiment, it is possible to prevent external output data DO from having a floating state, and it becomes possible to prevent the delay of access caused by the delayed data transfer.

Figure 5:
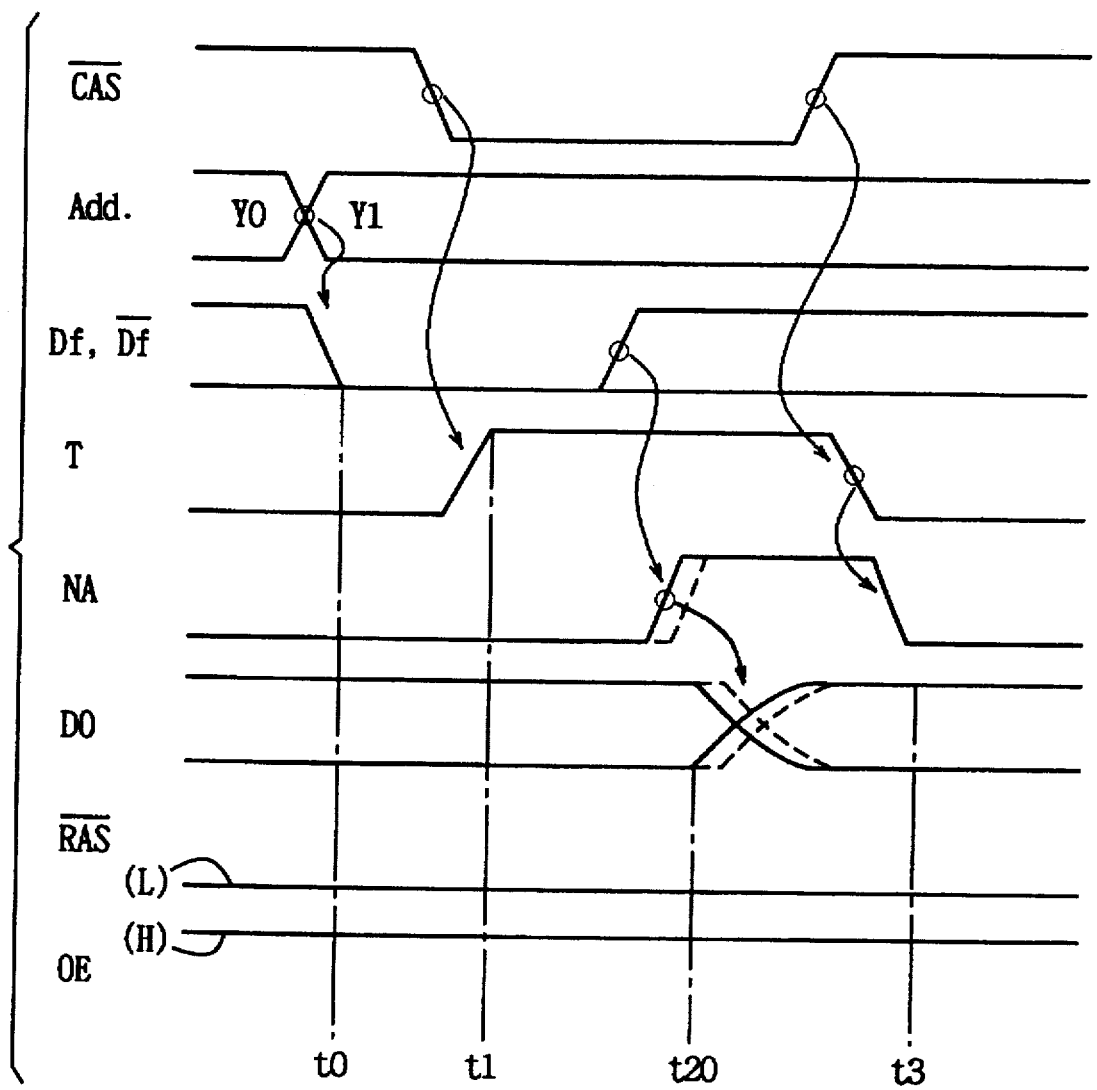
FIG. 5 is a timing chart showing the operational waveforms of various portions of the output circuit shown in FIG. 4.

Next, the operation of the output circuit shown in FIG. 4 will be explained. FIG. 5 is a timing chart showing the operational waveforms of various portions of this output circuit. The timing chart includes bit data Df and $\overline{Df}$ that are not amplified yet in place of bit data D and $\overline{D}$ shown in FIG. 3. The following explains the characteristic affair of this embodiment, and those common to FIG. 3 will not be repeated.

In FIG. 5, in response to the detection of the transfer of bit data Df and $\overline{Df}$ for the address Y1 by the gate control circuit GC, the control signal CS goes high, causing the node NA to have a high level.

In this case, the node NA goes high earlier in FIG. 5 than the case of FIG. 3 as shown by the dashed line because of the detection by the gate control circuit GC of the switching of bit data Df and $\overline{Df}$ prior to the amplification by the amplifying circuits A1 and A2.

In response to the rise of the logical level of the node NA, external output data DO begins to vary at time point t20. This timing (t20) of the switching of the external output data DO is earlier than the timing (t2) of the case of FIG. 3 as shown by the dashed line in FIG. 5. Accordingly, the output circuit of FIG. 4 has its external output data DO switched earlier than the output circuit of FIG. 2.

Third Embodiment

The third embodiment of this invention pertains to the output circuit which is connected to the circuit of multi-bit test at the time of multi-bit test.

Figure 6:
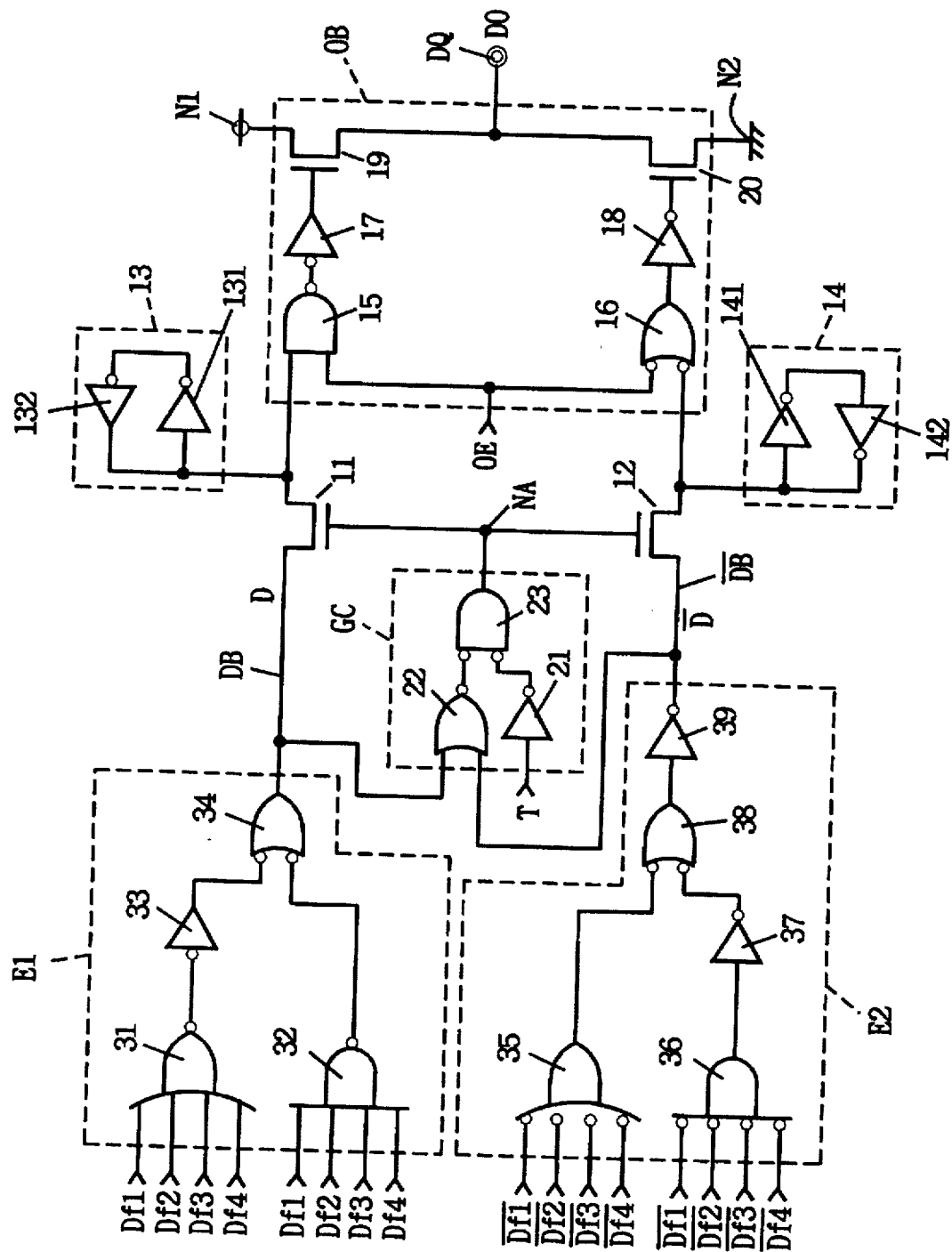
FIG. 6 is a schematic diagram of the principal portion of the output circuit based on a third embodiment.

FIG. 6 is a schematic diagram of the principal portion of the output circuit of this embodiment. In the figure, portions identical to those of FIG. 2 are referred to by the same symbols and the explanation thereof will be omitted.

The output circuit of FIG. 6 differs from that of FIG. 2 in the presence of an exclusive-NOR circuit E1 and an exclusive-OR circuit E2. The exclusive-NOR circuit E1 takes the exclusive negative logical sum of the bit data Df1 through Df4 provided by the pre-amplifiers PA1 through PA4, respectively, shown in FIG. 1 and places the resulting data D on the data line DB.

The exclusive-OR circuit E2 takes the exclusive logical product of the bit data $\overline{Df1}$ through $\overline{Df4}$ provided by the pre-amplifiers PA1 through PA4 shown in FIG. 1, respectively, and places the resulting data $\overline{D}$ on the data line $\overline{DB}$.

The exclusive-NOR circuit E1 consists of an NOR gate 31, an NAND gate 32, an inverter 33 and an NAND gate 34. The NOR gate 31 receives the bit data Df1 through Df4, and produces an output signal indicative of the negative logical product of the bit data and delivers the output signal by way of the inverter 33 to the NAND gate 34.

The NAND gate 32 receives the bit data Df1 through Df4, and produces an output signal indicative of the exclusive logical product of the bit data and delivers the output signal to the NAND gate 34. The NAND gate 34 produces data D indicative of the negative logical sum of the signals provided by the NAND gate 32 and inverter 33 on the data line DB.

The exclusive-OR circuit E2 consists of an NAND gate 35, an NOR gate 36, an inverter 37, an NAND gate 38 and an inverter 39. The NAND gate 35 receives the bit data $\overline{Df1}$ through $\overline{Df4}$, and produces an output signal indicative of the negative logical sum of the bit data and delivers the output signal to the NAND gate 38.

The NOR gate 36 receives the bit data $\overline{Df1}$ through $\overline{Df4}$, and produces an output signal indicative of the negative logical product of the bit data and delivers the output signal by way of the inverter 37 to the NAND gate 38.

The NAND gate 38 produces an output signal indicative of the negative logical sum of the signals provided by the NAND gate 35 and inverter 37. The output signal of the NAND gate 38 is inverted by the inverter 39 and placed as data $\overline{D}$ on the data line $\overline{DB}$.

The gate control circuit GC in the output circuit of FIG. 6 has its NOR gate 22 receiving the data D and $\overline{D}$ in the same manner as the circuit arrangement of FIG. 2.

Next, the operation of multi-bit test of the output circuit shown in FIG. 6 will be explained. In the multi-bit test, multiple bits (four bits in this embodiment) of the memory cell array 1 are tested concurrently.

Initially, same bit data is stored in one memory cell of each of the memory blocks MB1 through MB4 of the memory cell array 1, and thereafter bit data are read out of these four memory cells concurrently. In case all four bit data have the same logical level, these four memory cells are judged to be normal (PASS), or otherwise if all four bit data do not have the same logical level, these four memory cells are judged to include some defective memory cell(s) (FAIL).

FIG. 7 is a truth table showing the relation of the input/output levels of the output circuit shown in FIG. 6 for the multi-bit test. The table lists the logical levels of the input bit data Df1 through Df4 ($\overline{Df1}$ through $\overline{Df4}$) and data D ($\overline{D}$) placed on the data bus DB ($\overline{DB}$) and the result of judgment (PASS or FAIL). The operation of multi-bit test will be explained with reference to FIG. 6 and FIG. 7 for the case of storing high-level bit data in four memory cells to be tested.

In case bit data Df1 through Df4 read out of four memory cells are all high (or $\overline{Df1}$ through $\overline{Df4}$ are all low), the exclusive-NOR circuit E1 delivers high-level data D onto the data line DB, and the exclusive-OR circuit E2 delivers low-level data $\overline{D}$ onto the data line $\overline{DB}$. Based on the high-level data D and low-level data $\overline{D}$, the test result is "PASS".

Otherwise, if the bit data Df1 through Df4 are not all high (e.g., if Df2 is low), the data D becomes low and data $\overline{D}$ becomes high, and the test result is "FAIL".

For the case of storing low-level bit data in four memory cells to be tested, the operation of multi-bit test is identical to the case of storing high-level bit data described above.

In the output circuit of FIG. 6, the transfer gates 11 and 12 become conductive in response to the detection of the transfer of data D and $\overline{D}$ indicative of the result of multi-bit test onto the data line pair DB and $\overline{DB}$. External output data DO represented by the data newly placed on the data line pair is delivered to the outside.

Consequently, it is possible to prevent the external output data DO from having a floating state at the time of multi-bit test, and at the same time, it becomes possible to extend the duration of valid external output data in one operation cycle.

Fourth Embodiment

The fourth embodiment of this invention pertains to the output circuit which prevents the delay of access caused by the delayed data transfer at the time of multi-bit test.

Referring to FIG. 6, the exclusive-NOR circuit E1 and exclusive-OR circuit E2 connected for carrying out the multi-bit test include logic gates in several stages, causing the output data D and $\overline{D}$ to be delayed during the propagation through these logic gates. The delay of access caused by the delayed data transfer can be prevented by adopting the circuit arrangement as shown in FIG. 8.

Figure 8:
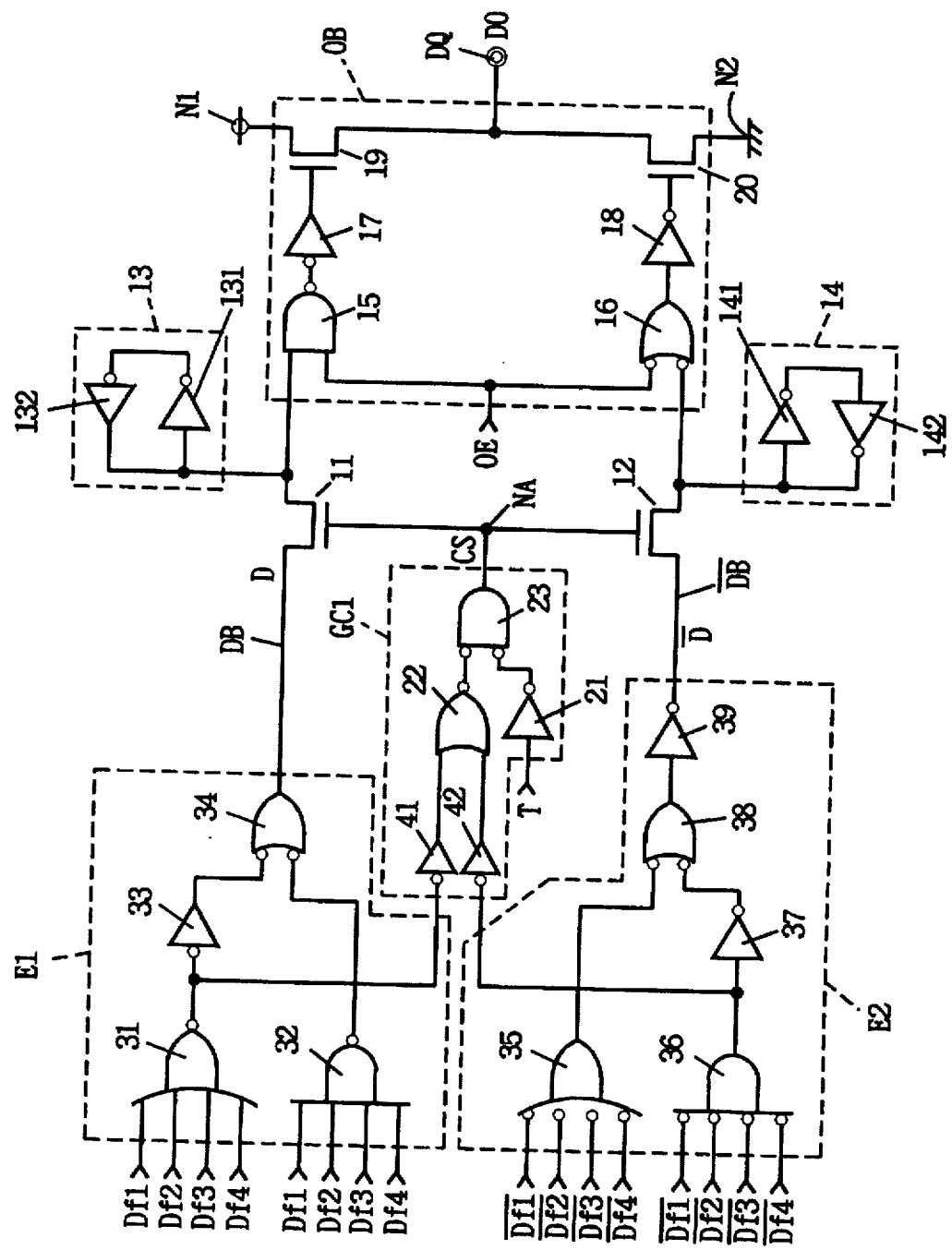
FIG. 8 is a schematic diagram of the principal portion of the output circuit based on a fourth embodiment.
Figure 9:
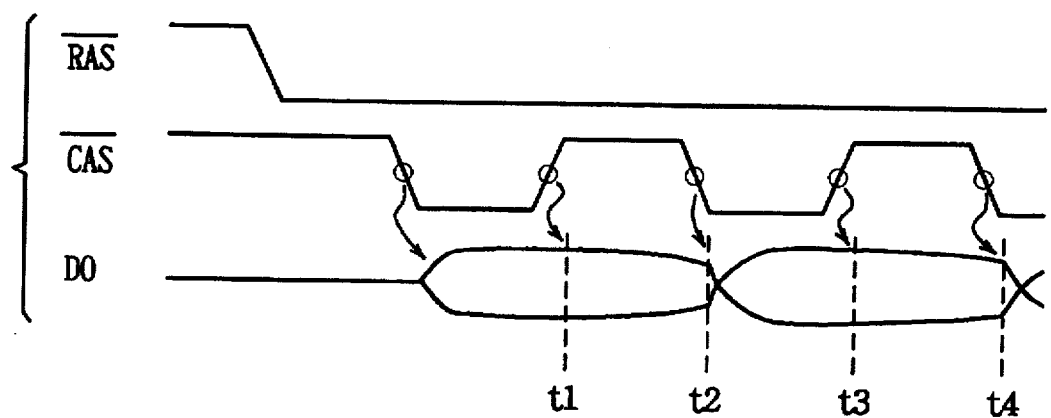
FIG. 9 is a timing chart showing the operational waveforms of the conventional DRAM having the fast page function.
Figure 10:
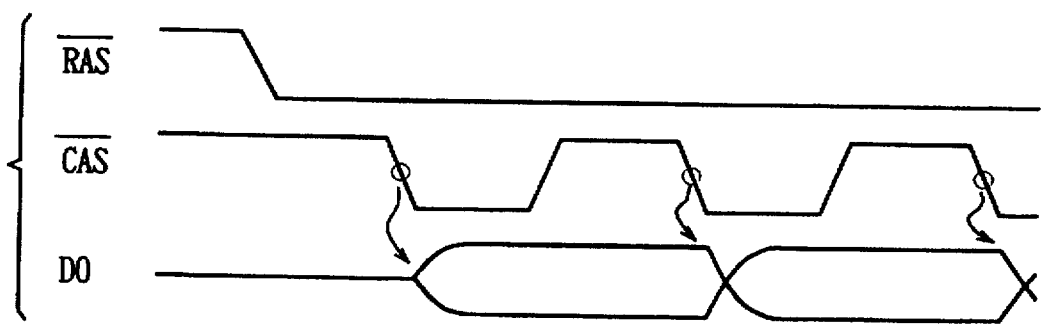
FIG. 10 is a timing chart showing the operational waveforms of the conventional DRAM having the EDO function.

FIG. 8 is a schematic diagram of the principal portion of the output circuit of this embodiment. In the figure, portions identical to those of FIG. 6 are referred to by the same symbols and the explanation thereof will be omitted.

The output circuit of FIG. 8 differs from that of FIG. 6 in the arrangement of the gate control circuit GC1. The gate control circuit GC1 includes inverters 41 and 42 in addition to the inverter 21 and NOR gates 22 and 23 shown in FIG. 6.

The inverter 41 is connected to the line, which connects the output terminal of the NOR gate 31 to the input terminal of the inverter 33, and one input terminal of the NOR gate 22, and it inverts the output signal of the NOR gate 31 and delivers the inverted signal to the inverter 22. The inverter 42 is connected to the line, which connects the output terminal of the NOR gate 36 to the input terminal of the inverter 37, and another input terminal of the NOR gate 22, and it inverts the output signal of the NOR gate 36 and delivers the inverted signal to the NOR gate 22.

The following explains the operation of the gate control circuit GC1 which is the characteristic affair of this output circuit.

In a reset state, i.e., all low, of bit data Df1 through Df4 and Df1 through Df4, both inverters 41 and 42 deliver high-level signals to the NOR gate 22, causing the control signal CS to become low.

Otherwise, if at least one of the NOR gates 31 and 36 produces a high-level output signal, i.e., some bit data in a non-reset state is (are) fed to the NOR gates 31 and 36, the control signal CS becomes high, provided that the internal control signal T is high.

Namely, the gate control circuit GC1 makes the transfer gates 11 and 12 conductive in response to the detection of data output from the NOR gates 31 and 36 in the exclusive-NOR circuit E1 and exclusive-OR circuit E2 following the transfer of some bit data to at least one of these gates.

Accordingly, the output circuit of FIG. 8 is capable of turning on the transfer gates 11 and 12 earlier than the circuit shown in FIG. 6.

Consequently, this output circuit of FIG. 8 has its external output data DO switched faster than the circuit of FIG. 6, and it is possible to prevent external output data DO from having a floating state and in addition to prevent the delay of access caused by the delayed data transfer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:

a memory cell array including a plurality of memory cells for storing bit data;

a data line which carries the bit data read out from a memory cell of said memory cell array;

gate control means configured for detecting, at the time of data readout, that the bit data from said memory cell array is placed on said data line, and in response generating a control signal;

gate means configured for receiving said control signal, and in response transferring the bit data placed on said data line;

latch means configured for receiving and holding the bit data from said gate means; and output buffer means which outputs data represented by the bit data held in said latch means.

2. A semiconductor memory according to claim 1, wherein said gate control means is further configured for receiving an internal control signal derived from a column address strobe signal, and generating said control signal during an active state of said internal control signal.

3. A semiconductor memory according to claim 2, wherein said gate control means includes:

first logic means which produces a first logical signal indicative of a negative logical product of logical levels of the bit data carried by said data line;

second logic means which produces a second logical signal that is an inverted signal of said internal control signal; and third logic means which produces a third logical signal indicative of a negative logical product of said first and second logical signals, said third logical signal being delivered as said control signal to said gate means.

4. A semiconductor memory according to claim 1 further including amplifying means inserted amid the path of said data line and adapted to amplify the bit data transferred from the memory cell to said data line, wherein said gate control means is further configured for generating said control signal before the bit data is amplified by said amplifying means.

5. A semiconductor memory according to claim 4, wherein said gate control means is further configured for receiving an internal control signal derived from a column address strobe signal, and generating said control signal during an active state of said internal control signal.

6. A semiconductor memory according to claim 5, wherein said gate control means includes:

first logic means which produces a first logical signal indicative of a negative logical product of logical levels of the bit data carried by said data line;

second logic means which produces a second logical signal that is an inverted signal of said internal control signal; and third logic means which produces a third logical signal indicative of a negative logical product of said first and second logical signals, said third logical signal being delivered as said control signal to said gate means.

7. A semiconductor memory according to claim 1, wherein said gate control means is further configured for reading values from said data line for detecting that the bit data is placed on said data line based said values.

8. A semiconductor memory capable of testing a plurality of bits concurrently, said memory comprising:

a memory cell array including a plurality of memory cells for storing bit data;

first logic gate means which, at the time of testing, receives multiple bit data of a first polarity out of bit data pairs read out simultaneously from the memory cells in which same bit data has been stored, and produces first data indicative of an exclusive negative logical product of said multiple bit data of the first polarity;

second logic gate means which, at the time of testing, receives multiple bit data of a second polarity out of bit data pairs read out simultaneously from said memory cells, and produces second data indicative of an exclusive logical product of said multiple bit data of the second polarity;

a data line which carries the first and second data produced by said first and second logic gate means;

gate control means configured for detecting, at the time of testing, that said first and second data are placed on said data line, and in response generating a control signal;

gate means configured for receiving said control signal, and in response transferring the first and second data placed on said data line;

latch means configured for receiving and holding the first and second data from said gate means; and output buffer means which outputs data represented by the first and second data held in said latch means.

9. A semiconductor memory according to claim 8, wherein said gate control means is further configured for receiving an internal control signal derived from a column address strobe signal, and generating said control signal during an active state of said internal control signal.

10. A semiconductor memory according to claim 8, wherein said first logic gate means includes:

a first NOR gate which produces data indicative of a negative logical product of the multiple bit data of the first polarity received at testing; and first logic means connected between said first NOR gate and said gate means, and said second logic gate means includes:

a second NOR gate which produces data indicative of a negative logical product of the multiple bit data of the second polarity received at testing; and second logic means connected between said second NOR gate and said gate means, wherein said gate control means is further configured for receiving the data produced by said first and second NOR gates and generating said control signal based on logical levels of these data.

11. A semiconductor memory according to claim 10, wherein said gate control means is further configured for receiving an internal control signal derived from a column address strobe signal, and generating said control signal during an active state of said internal control signal.

12. A semiconductor memory according to claim 11, wherein said gate control means includes:

a first inverter which produces a first logical signal that is an inverted version of the data produced by said first NOR gate;

a second inverter which produces a second logical signal that is an inverted version of the data produced by said second NOR gate;

a third NOR gate which produces a third logical signal indicative of a negative logical product of said first and second logical signals;

a third inverter which produces a fourth logical signal that is an inverted version of said internal control signal; and a fourth NOR gate which produces a fifth logical signal indicative of a negative logical product of said third and fourth logical signals, said fifth logical signal being delivered as said control signal to said gate means.

13. A semiconductor memory according to claim 8, wherein said gate control means is further configured for reading values from said data line for detecting that said first and second data are placed on said data line based said values.

* * * * *